United States Patent
Chmielewski

(10) Patent No.: US 6,414,488 B1
(45) Date of Patent: Jul. 2, 2002

(54) METHOD AND APPARATUS FOR DECOUPLING MAGNETIC RESONANCE RECEIVE COILS

(75) Inventor: Thomas Chmielewski, Willoughby Hills, OH (US)

(73) Assignee: Koninklijke Philips Electronics N.V., Highland Heights, OH (US)

( * ) Notice: Subject to any disclaimer, the term of this patent is extended or adjusted under 35 U.S.C. 154(b) by 0 days.

(21) Appl. No.: 09/516,978

(22) Filed: Mar. 1, 2000

(51) Int. Cl.$^7$ ................................................. G01V 3/00
(52) U.S. Cl. ........................................ 324/311; 324/322
(58) Field of Search ............................... 324/318, 322, 324/309, 307, 300, 313, 311; 600/422

(56) References Cited

U.S. PATENT DOCUMENTS

| | | | |
|---|---|---|---|
| 4,725,779 A | 2/1988 | Hyde et al. | 324/318 |
| 4,793,356 A | 12/1988 | Misic et al. | 600/422 |
| 4,839,594 A * | 6/1989 | Misic et al. | 324/318 |
| 5,166,618 A * | 11/1992 | Jones et al. | 324/318 |
| 5,221,902 A * | 6/1993 | Jones et al. | 324/318 |
| 5,256,972 A | 10/1993 | Keren et al. | 324/318 |
| 5,278,505 A * | 1/1994 | Arakawa | 324/322 |
| 5,363,845 A * | 11/1994 | Chowdhury et al. | 600/422 |
| 5,751,146 A * | 5/1998 | Hrovat | 324/318 |

* cited by examiner

*Primary Examiner*—Edward Lefkowitz
*Assistant Examiner*—Tiffany A. Fetzner
(74) *Attorney, Agent, or Firm*—Fay, Sharpe, Fagan, Minnich & McKee, LLP

(57) ABSTRACT

A magnetic resonance imaging apparatus creates images by exciting magnetic resonance in selected nuclei disposed within an image region. Through the image region a main magnetic field ($B_0$) is applied and transverse gradients are produced. At selected times a high power RF pulse is applied to the imaging region causing the selected nuclei to resonate. These magnetic resonance signals are detected by a receive coil ($D_1$, $D_2$) and converted into an image representation viewable on a display (24). Images are obtained by repeating the transmit and receive portions until enough image data is received to produce an image. The receive coil ($D_1$, $D_2$) includes first decoupler circuits (28) arranged about the coil. During the transmit portion of the cycle, the decoupler circuits sense the high power RF pulse and decouple the coil. High speed switching diodes or PIN diodes are excited by the transmit RF pulse to switch inductors (40) into the coil to decouple the receive coil. During a receive portion of a cycle in which the coil is not used, a DC bias is selectively applied to the coil forcing the diodes on, actively decoupling the coil. The DC bias also biases a diode switch (50, 50') to short the input of a preamplifier element (48, 48') providing protection.

10 Claims, 4 Drawing Sheets

METHOD AND APPARATUS FOR DECOUPLING MAGNETIC RESONANCE RECEIVE COILS

BACKGROUND OF THE INVENTION

The present invention relates to radio frequency (RF) receive coils for magnetic resonance scanners. The invention finds particular application in isolating or decoupling an RF receive coil during an imaging process. It is to be appreciated however, that the present invention may find further application in isolating individual coil portions of a single coil or in other arts in which selective RF signal reception is practiced.

Magnetic resonance imaging (MRI) machines apply a main magnetic field through an examination region. This strong field, typically denoted $B_0$, acts to align the nuclei within a subject to be examined. In some MRI machines, the $B_0$ field is horizontally oriented, and in others it is vertically oriented.

In both horizontally and vertically oriented systems, magnetic resonance is excited in the aligned nuclei by a relatively strong orthogonal RF field, typically denoted $B_1$. The $B_1$ field causes the aligned nuclei or spins to tip into an plane orthogonal to the static magnetic field $B_0$. Over time, the spins realign themselves with the $B_0$ field emitting relatively weak radio frequency (RF) resonance signals as they precess. This resonance is detected by RF coils tuned to the specific resonance frequency desired. These resonance signals are passed to image processing equipment to reconstruct the signals into an image representation for display on a video monitor.

Typically, the transmit RF signals are orders of magnitude larger than the magnetic resonance signals generated by the excited nuclei and detected by the RF receive coils. To protect the sensitive receiver equipment and the coils, the receive coils are typically decoupled or detuned during the transmit phase of an imaging procedure. Accordingly, it is known to decouple receive coils using semiconductor switches or PIN diodes in conjunction with LC circuitry using one of two principal variants, namely active decoupling and passive decoupling.

With active decoupling, during the transmit phase of an imaging operation a bias is applied to a PIN diode semiconductor switch in conjunction with an LC circuit to decouple or detune the coil. As technology has improved and the power of the transmit RF pulses has increased and increasingly higher bias currents on the switching diodes have been used to ensure the receiver coil remains decoupled. Unfortunately, these higher bias currents introduce magnetic field distortions in the $B_0$ field close to the subject degrading the image obtained.

With passive decoupling, antiparallel diode semiconductor switches in conjunction with LC circuitry are also employed. In this method, antiparallel combinations of high speed switching diodes decouple the coil in response to the transmit pulse itself. In other words, when the antiparallel combination of diodes is exposed to the high power transmit signal, each diode conducts during its respective half cycle. This allows high currents, but not low currents, to see a parallel resonant LC circuit which decouples the coil. While this method employs no bias currents and eliminates the associated $B_0$ field distortions, the coil is always decoupled during the RF transmit pulse and always coupled or active during receive.

The present invention contemplates an improved method and apparatus to decouple a receive coil which overcomes the above-referenced problems and others.

SUMMARY OF THE INVENTION

In accordance with one aspect of the present invention, a magnetic resonance imaging system includes a main magnetic field generator which produces a $B_0$ field through an imaging region and a gradient field generator which produces gradients across the $B_0$ field. A radio frequency transmitter coil transmits RF pulses through the imaging region to excite nuclei and generate magnetic resonance signals to be reconstructed into human readable images. A first arrangement of receive coil elements is configured to decouple during the transmit phase and is configured to receive the magnetic resonance signals during the receive phase. A second arrangement of receive coil elements is configured to decouple during both the transmit and receive phases.

In accordance with another aspect of the present invention, an electrical path is provided which conducts received magnetic resonance signals away from the first arrangement of receive coil elements and conducts bias currents to at least the second arrangement of receive coil elements.

In accordance with another aspect of the present invention, the second arrangement of receive coil elements includes decoupler circuits which inhibit coil elements from resonating both when exposed to a determined RF transmit pulse and when exposed to a DC bias current.

In accordance with another aspect of the present invention, the decoupler circuits include a capacitive element selected to tune the coil elements to the magnetic resonance frequency spectrum. An inductive element is selectively switched into parallel with the capacitive element to parallel resonate at the resonance frequency spectrum.

In accordance with another aspect of the present invention, the inductive element is switched by a switch including an antiparallel combination of diodes in series with the inductive element. The diodes selected to alternate between a substantially conductive state in response to the presence of the RF pulse from a substantially non-conductive state.

In accordance with another aspect of the present invention, where the inductive element is switched by an antiparallel combination of diodes in series with the inductive element. Selected diodes being switched from a substantially non-conductive state to a substantially conductive state in response to an applied DC bias.

In accordance with another aspect of the present invention, the first arrangement of receive coil elements consists of a first RF receive coil, while the second arrangement of receive coil elements consists of a second RF receive coil.

In accordance with another embodiment of the present invention, a method of magnetic resonance imaging includes passively decoupling receive coil elements in response to a transmitted radio frequency pulse. Following the passively decoupling step magnetic resonance signals are received in selected receive coil elements and other receive coil elements are actively decoupled.

In accordance with another aspect of the present invention, the passively decoupling step includes alternately switching a pair of antiparallel diodes to a conductive state in response to the RF transmit pulse permitting an inductive element and a capacitive element to parallel resonate during the transmit pulse providing a high impedance across the coil elements.

In accordance with another aspect of the present invention, the actively decoupling step includes applying a DC bias current to diode switches to parallel resonate a capacitive element and an inductive element to provide a high impedance across the coil elements.

In accordance with another embodiment of the present invention, a radio receive coil includes a plurality of first switch circuits disposed about the coil. The first switch circuits being biased to passively decouple the coil in response to a transmit pulse. A control signal path is also provided through which a DC bias is applied to the coil to bias the first switch circuits to actively decouple the coil in response to the DC bias.

In accordance with another aspect of the present invention, the coil further includes a second switched circuit which is biased to provide an RF or AC short at an input of a preamp.

In accordance with another aspect of the present invention, the first switch circuits include an inductive element and a capacitive element selected to parallel resonate at a desired frequency. An antiparallel combination of diodes in series with the inductive element are selected to conduct in response to both a transmit pulse and the DC bias.

In accordance with another aspect of the present invention, the second switch circuits include a diode biased between conductive and non-conductive states by the DC bias.

In accordance with another aspect of the present invention, the control signal path includes an electrical path between a DC current source and a coil. The path further includes at least one DC blocking capacitor for routing the DC bias to the first and second switch circuits.

One advantage of the present invention resides in the ability to passively decouple an RF receive coil during a transmit phase of a magnetic resonance imaging event while actively decoupling the coil during a receive phase using the same decouplers.

Another advantage of the present invention resides in the use of low switching or bias currents to actively decouple the coil during the receive phase minimizing $B_0$ distortion as compared to other actively decoupled coils.

Another advantage of the present invention resides in the ability to reconfigure a localized receive coil for different applications.

Another advantage of the present invention resides in the ability to permanently or semi-permanently install a receive coil within a couch of an MR system without causing interference with other localized coils.

Still further advantages of the present invention will become apparent to those of ordinary skill in the art upon reading and understanding the following detailed description of the preferred embodiments.

BRIEF DESCRIPTION OF THE DRAWINGS

The invention may take physical form in certain parts and arrangements of parts, and in certain steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
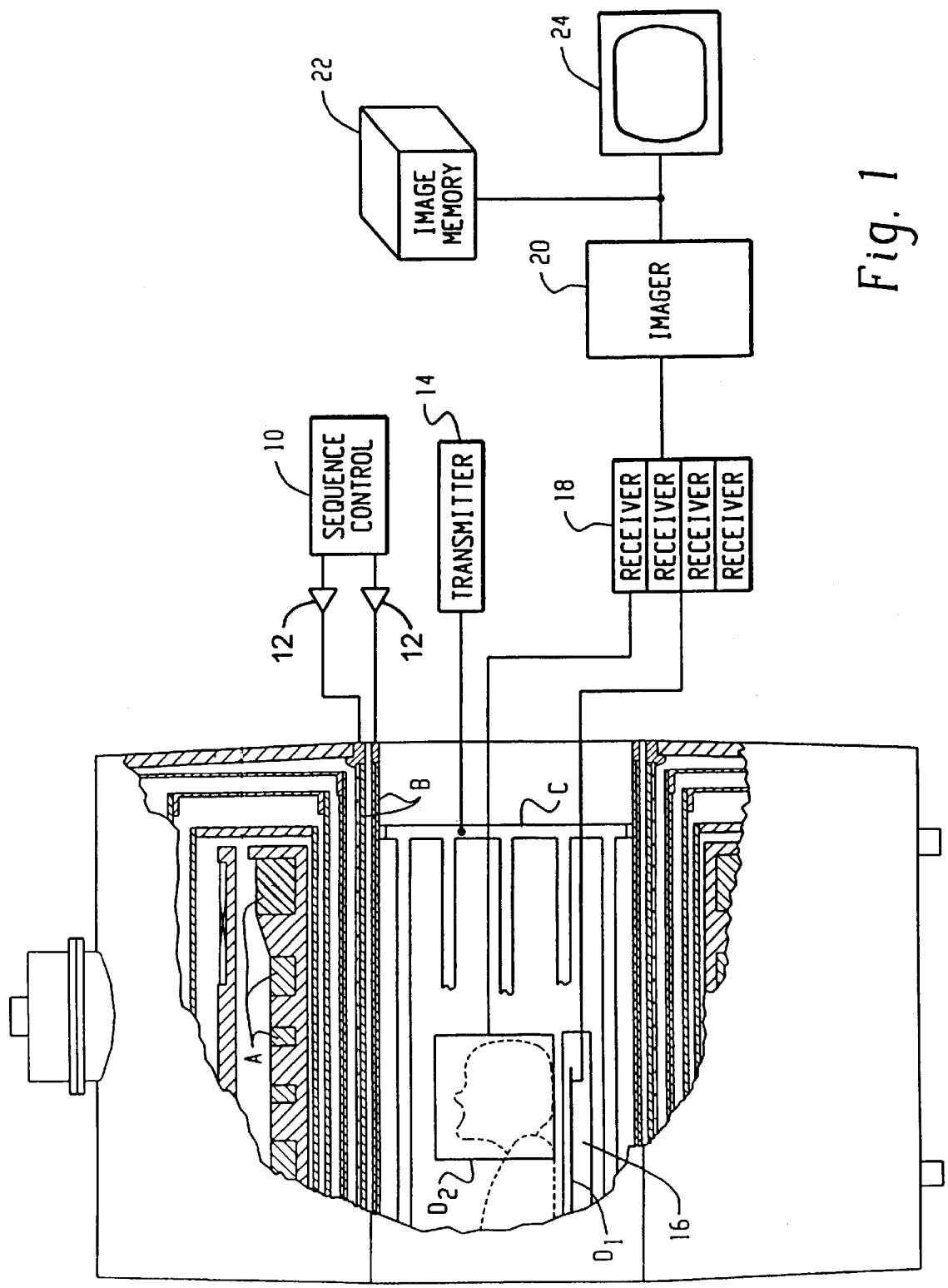
FIG. 1 is a diagrammatic illustration of a magnetic resonance imaging apparatus incorporating the present invention.

With reference to FIG. 1, a magnetic resonance imaging apparatus includes a main magnetic field generator A for establishing a temporally constant, main magnetic field $B_0$ through an examination region. Gradient magnetic field coils B selectively produce magnetic field gradients transversely across the main magnetic field of the imaging region. An RF transmitter coil C, selectively transmits radio frequency resonance excitation and manipulation pulses during a transmit portion of each transmit/receive cycle. These high power excitation and manipulation pulses excite magnetic resonance in the nuclei of the subject disposed in the imaging region. The resonating nuclei generate radio frequency signals of a frequency which is determined by the strength of the magnetic field and other variables such as the specific nuclei targeted. A magnetic resonance imaging sequence controller 10 is functionally connected to drivers 12 for the gradient coils B and a transmitter 14 for driving the transmit coil C. The sequence control 10 coordinates the generation of, and sequencing for, the gradient and resonance exciting pulse.

In the illustrated embodiment, a first receive coil $D_1$, is semi-permanently embedded within the movable patient couch 16, while a second receive coil $D_2$ is selected and placed in the imaging area only when desired. During a receive portion of each transmit/receive cycle, a selected one of the receive coils, for example $D_2$, passes received RF signals to a receiver 18. An imager 20, such as a two-dimensional Fourier transform imaging processor, reconstructs one or more electronic image representations from the received radio frequency signals that are stored in an image memory 22. Typically, the electronic images are representative of density, position, relaxation time, and other characteristics of the resonating nuclei in each voxel of the imaging volume. A video monitor, flat panel display, or other human readable display mechanism 24 converts portions of the electronic image representation to human readable images.

While the magnetic resonance imaging system has been described with respect to a single frequency horizontally oriented magnetic resonance imaging system, those skilled in the art will appreciate that the principles disclosed are equally applicable to multi-frequency systems, vertically oriented systems, off-axis coils, and the like.

Figure 2:
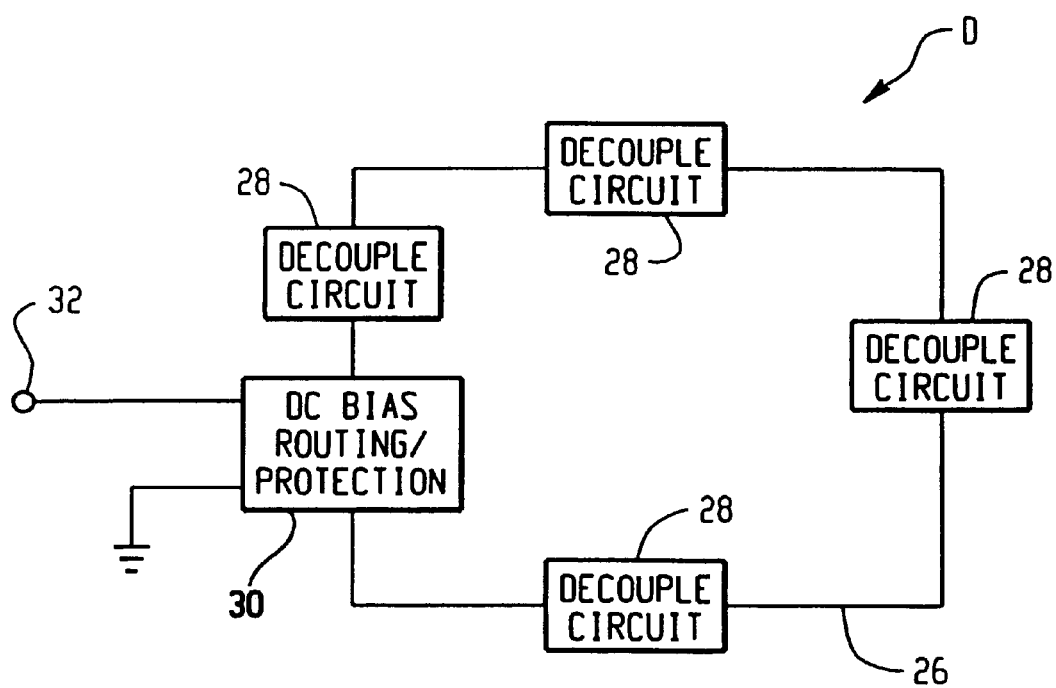
FIG. 2 is a simplified illustration of a receive coil for suitably practicing the present invention.

Referring now to FIG. 2, a receive coil $D_1$ includes a pick-up winding 26, decoupling circuits 28, and DC bias routing and protection circuitry 30. A port 32 is also provided for both transferring received signals (when coupled) to the receiver 18 (FIG. 1), and for supplying a bias current, to the routing and protection circuitry 30 when it is desirable to decouple the coil. In an exemplary model, the coil $D_1$ is semi-permanently disposed on the sliding patient couch, and is thus present in the imaging region during all imaging procedures. As is conventional, the coil $D_1$ is decoupled during the transmit portion of the transmit/receive cycle. This is accomplished using passive techniques.

During the receive cycle, another coil $D_2$ is present in the imaging area in the embodiment of FIG. 1. If ignored, the presence of two coils in the imaging area both tuned to the same resonance frequency causes coupling between the coils and other undesirable interactions. Accordingly, a DC bias is also selectively activated in coil $D_1$ during receive when coil $D_2$ is also present. Advantageously, due to the comparatively small receive signals, a correspondingly small bias current, on the order of tens of milliamps, effectively decouples the coil $D_1$. Preferably, the DC bias is supplied to the coil and is properly routed through the decoupling circuits 28 in the pick-up winding 26.

Figure 3:
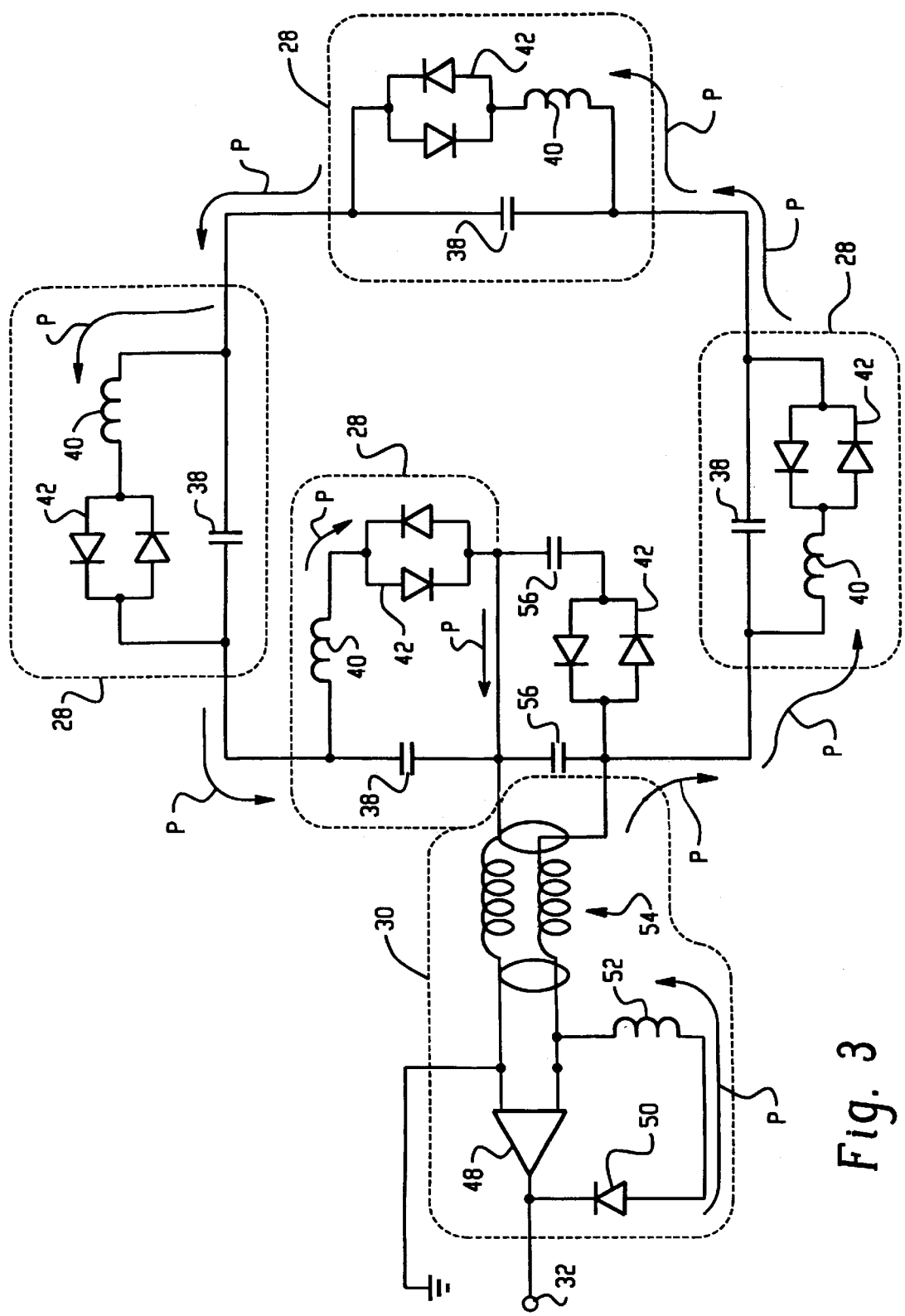
FIG. 3 is a simplified schematic illustration of a coil according to an embodiment of the present invention.

With reference now to FIG. 3, an exemplary coil is shown. As is typical of MR receive coils, capacitive elements 38 are typically spaced throughout the coil to tune it to specified resonant frequencies. These capacitive elements 38 provide places where a parallel inductive element 40 can be switched in or out using switches 42, such as switching diodes or high speed PIN diodes. As illustrated, the switch 42 includes two high speed switching diodes connected antiparallel to provide passive switching. When such a switch is exposed to a high power transmit signal, each diode within the switch will conduct during its respective half cycle. This produces a high impedance across the decoupling circuit 28, decoupling the coil.

Under conditions where it is desirable to decouple the coil $D_1$ while other coils receive the magnetic resonance signal, a small DC bias is applied to the switch 42 which forces the coupler on, again decoupling the coil. Indeed, the DC bias is applied even during the transmit cycle to ensure decoupling in low power transmit cycles. Thus, the diode switch 42 are switched conductive to decouple the coil either passively by a large received RF current inducing a voltage on the capacitor 38 higher than the threshold voltage, or by an applied DC bias greater than the threshold. The threshold, of course, is higher than the voltages induced across the capacitor 38 by resonance signals.

Continued reference to FIG. 3 shows a receiver port 32 and details an embodiment of the DC bias routing and protection circuit 30. The DC signal is applied at the RF port 32 upstream of a pre-amp 48 and is also applied through a diode 50 and an inductive element 52 which acts as an alternating current block. A DC bias through diode 50 shuts of f the pre-amp 48. In other words, during the transmit cycle, the DC bias shorts the input of the pre-amp 48 for protection. The inductor 52 provides RF blocking. The DC bias continues through coaxial cable 54 into the coil. The path of the DC current through the coil is illustrated by the arrow in the figure. A DC blocking capacitor 56 maintains proper routing for the DC bias around the coil 26.

Figure 4:
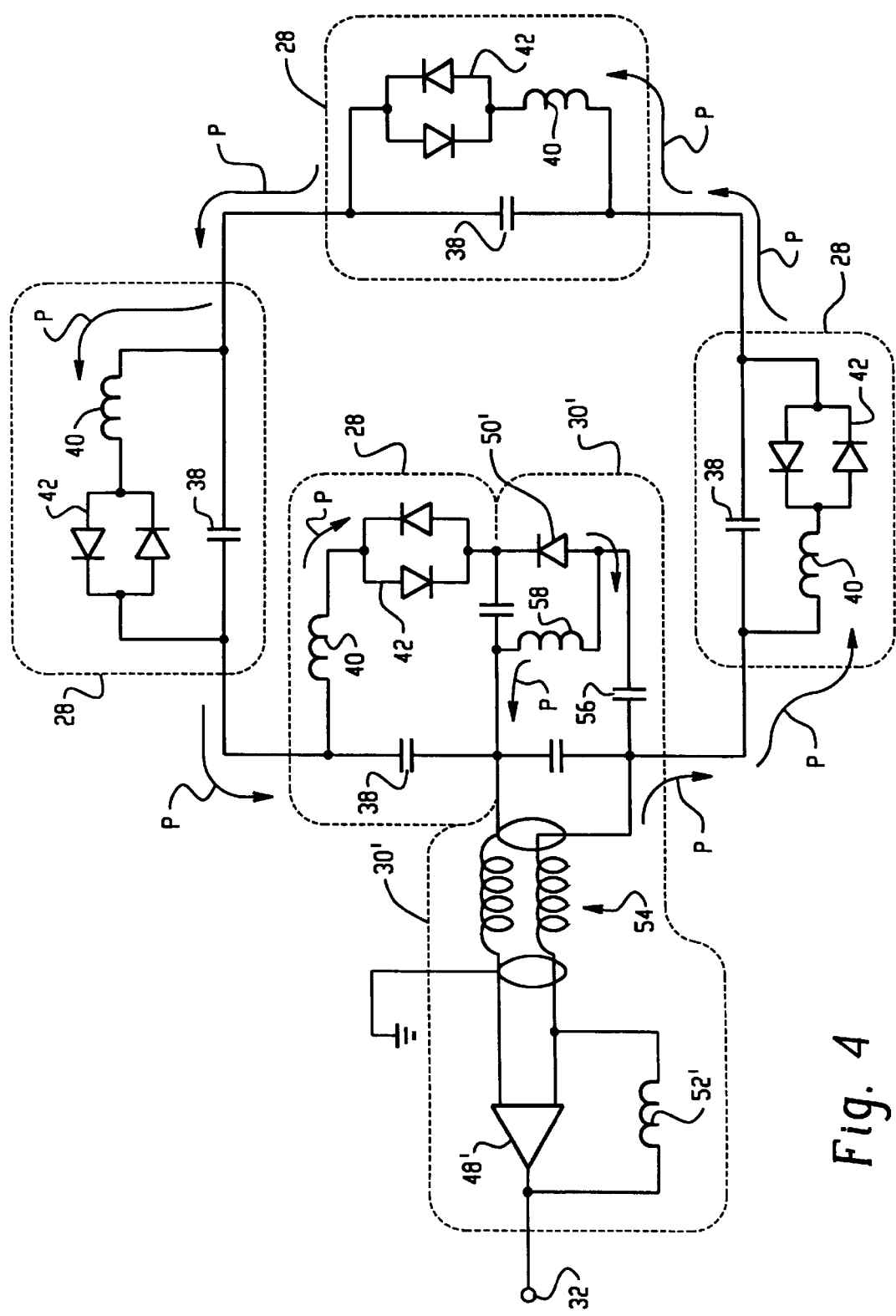
FIG. 4 is a simplified schematic illustration of a coil according to an alternate embodiment of the present invention.

Referring now to FIG. 4, another embodiment is shown with like components designated by like reference numerals and analogous components designated by a prime ('). In this embodiment, the DC bias current path is shown as indicated by the arrow. As is evident, the low voltage DC current decouples the coil at each decoupler 28 and completes the path through a diode 50 and inductor 52 which biases the diode 50 shorting out the coil, i.e. passes AC currents to ground rather than to the pre-amp 48. That is, the input of the pre-amp is "shorted" through capacitors to ground shorting it against AC components.

Cross referencing both FIGS. 3 and 4, those skilled in the art can now appreciate that the RF receive coil is passively decoupled by the antiparallel diode switch 42 during high power RF transmit cycles. Additionally, the DC bias current ensures that the RF receive coil does not couple with other coils within the imaging system during the receive cycle. Additionally, the relatively low DC bias currents do not adversely affect the $B_0$ field.

The invention has been described with reference to the preferred embodiments. Modifications and alterations will naturally occur to others upon reading and understanding the preceding detailed description. For example, artisans will appreciate that the invention can be utilized to alternate between modes in a coil supportive of more than one mode, for example a quadrature coil. Moreover, high speed PIN diodes can be used in place of the switching diodes illustrated for applications requiring higher power handling capabilities (increased rms current through diodes) or reduced capacitance. It is intended that the invention be construed as including all such modifications and alterations insofar as the come within the scope of the appended claims, or the equivalents thereof.

Having thus described the preferred embodiment, the invention is now claimed to be:

1. A magnetic resonance imaging system which has a transmit phase and a receive phase, the system comprising:
   a main magnetic field generator which produces a $B_0$ field through an imaging region;
   a gradient field generator which produces field gradients across the $B_0$ field;
   a radio frequency transmitter coil which selectively transmits an RF transmit pulse having a resonance frequency spectrum through the imaging region during the transmit phase, exciting nuclei in the imaging region to generate magnetic resonance signals in the resonance frequency spectrum;
   an RF receive coil which resonates in the resonant frequency spectrum to receive the magnetic resonance signals during the receive phase; and
   a decoupler circuit for inhibiting the RF receive coil from resonating during the transmitted RF pulse, the decoupler circuit including a means for actively decoupling the receive coil during the transmit phase by applying a DC bias current which prevents the receive coil from resonating in the resonance frequency spectrum and a means for passively decoupling the RF receive coil when exposed to the RF transmit pulse in the absence of the DC bias current such that the receive coil is passively decoupled during the transmitted RF pulse upon a failure of the active decoupling means whereby both active and passive switching can be performed individually and concurrently in the same coil construction.

2. The magnetic resonance imaging system as set forth in claim 1, wherein the decoupler circuits comprise:
   a capacitive element selected to tune the receive coil to the magnetic resonance frequency spectrum; and,
   an inductive element which is selectively switched into parallel with the capacitive element to parallel resonate at the resonance frequency spectrum.

3. The magnetic resonance imaging system as set forth in claim 2, wherein the inductive element is switched by a switch comprising an antiparallel combination of diodes in series with the inductive element.

4. A method of magnetic resonance imaging comprising:
   during a transmit phase, transmitting high power radio frequency signals in a magnetic resonance frequency spectrum into an object to be imaged inducing low power magnetic resonance signals in the magnetic resonance frequency spectrum;
   receiving the induced magnetic resonance signals with a receive coil, the receive coil including a plurality of capacitive elements which tune the receive coil to resonate in the magnetic resonance frequency spectrum, at least one of the capacitors being mounted in parallel with an inductor element connected in series with antiparallel connected diodes such that when the antiparallel diodes are biased conductive, the inductor is connected in parallel with the capacitor to detune the receive coil from resonating in the magnetic resonance frequency spectrum;

in the transmission of high power radio frequency signals, inducing currents in the receive coil which bias the diodes conductive passively detuning the receive coil;

concurrently with the transmission of the high power radio frequency signal, applying a DC bias to the receive coil to bias the diodes conductive actively detuning the receive coil;

after transmitting the high power radio frequency signal, stopping applying the DC bias and receiving the low power induced magnetic resonance signals with the receive coil;

reconstructing the received magnetic resonance signals into an image representation.

5. The method as set forth in claim 4 wherein the antiparallel connected diodes are selected such that radio frequency currents induced in the receive coil by the transmitted high power radio frequency signals bias the diodes conductive passively detuning the receive coil.

6. The method as set forth in claim 4 wherein the DC bias is a milliampere current.

7. The method as set forth in claim 4 further including:

during transmitting of the high power radio frequency signals, shorting an input of a preamplifier which amplifies signals induced in the receive coil such that any currents induced in the receive coil while the high power radio frequency signal is being transmitted are blocked from reaching the preamplifier.

8. The method as set forth in claim 7 wherein the shorting step includes:

applying the DC bias to a diode associated with the preamplifier.

9. A magnetic resonance system in which high power radio frequency signals in a preselected magnetic resonance frequency spectrum are transmitted into a region of an object to be examined, which high power radio frequency signals induce low power resonance signals in the preselected magnetic resonance frequency spectrum, including:

a receive coil mounted adjacent the region of the object to be examined, the receive coil including:

a loop disposed adjacent the region of the object to be examined, a plurality of capacitive elements disposed around the loop to tune the loop to the preselected magnetic resonance frequency spectrum such that the loop picks up the low power induced magnetic resonance signals and the high power RF signals, a preamplifier connected with the loop for amplifying the picked up low power magnetic resonance signals, at least one detuning circuit connected in parallel with at least one of the capacitive elements for detuning the loop out of the preselected resonance frequency spectrum such that the loop becomes insensitive to the high power radio frequency signals in the preselected magnetic resonance frequency spectrum and the induced magnetic resonance signals, the detuning circuit including an inductor connected in series with a pair of antiparallel connected diodes;

a means for applying a DC bias to the current loop while the high power RF signals are being transmitted into the object to actively detune the receive coil whereby the receive coil is actively and passively detuned concurrently.

10. The magnetic resonance apparatus as set forth in claim 9 further including:

an preamplifier protection circuit which shuts off the preamplifier in response to the DC bias.

* * * * *